(12) United States Patent
Choi

(10) Patent No.: US 11,075,233 B2
(45) Date of Patent: Jul. 27, 2021

(54) SEMICONDUCTOR DEVICE AND FABRICATING METHOD OF THE SAME

(71) Applicant: Samsung Electronics Co., Ltd., Suwon-si (KR)

(72) Inventor: Hoon Sung Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 495 days.

(21) Appl. No.: 15/862,704

(22) Filed: Jan. 5, 2018

(65) Prior Publication Data

US 2018/0374880 A1 Dec. 27, 2018

(30) Foreign Application Priority Data

Jun. 21, 2017 (KR) .................. 10-2017-0078576

(51) Int. Cl.
| | |
|---|---|
| *H01L 21/762* | (2006.01) |
| *H01L 27/12* | (2006.01) |
| *H01L 21/84* | (2006.01) |
| *H01L 27/13* | (2006.01) |
| *H01L 29/786* | (2006.01) |
| *H01L 21/761* | (2006.01) |

(52) U.S. Cl.
CPC ............ *H01L 27/13* (2013.01); *H01L 21/761* (2013.01); *H01L 21/76243* (2013.01); *H01L 21/76267* (2013.01); *H01L 21/76275* (2013.01); *H01L 21/76283* (2013.01); *H01L 21/84* (2013.01); *H01L 27/1203* (2013.01); *H01L 27/1207* (2013.01); *H01L 29/78603* (2013.01)

(58) Field of Classification Search
CPC . H01L 21/84; H01L 27/1203; H01L 27/1207; H01L 21/761; H01L 21/76267; H01L 21/76275; H01L 21/76283; H01L 21/76243
See application file for complete search history.

(56) References Cited

U.S. PATENT DOCUMENTS

| | | | |
|---|---|---|---|
| 6,452,234 | B1 | 9/2002 | Mahanpour |
| 7,205,190 | B2 | 4/2007 | Okihara |
| 9,257,984 | B2 | 2/2016 | Singh et al. |
| 9,391,057 | B2 | 7/2016 | Fenouillet-Beranger et al. |
| 9,460,978 | B1 | 10/2016 | Or-Bach et al. |
| 9,590,118 | B1 | 3/2017 | Smith et al. |
| 9,608,112 | B2 | 3/2017 | Smith et al. |
| 2014/0015052 | A1* | 1/2014 | Fenouillet-Beranger .................. H01L 27/0296 257/348 |

(Continued)

*Primary Examiner* — Zandra V Smith
*Assistant Examiner* — Abbigale A Boyle
(74) *Attorney, Agent, or Firm* — Harness, Dickey & Pierce, P.L.C.

(57) ABSTRACT

A semiconductor device and a fabricating method of the same are provided. The semiconductor device a substrate including an active region defined by an element isolation film, an impurity region having a first conductivity type in the active region, a first semiconductor film of a second conductivity type on the impurity region, a buried insulating film on the first semiconductor film, a second semiconductor film on the buried insulating film, and a well contact connected to the first semiconductor film. The level of a lowermost surface of the first semiconductor film is higher than a level of a lowermost surface of the element isolation film.

20 Claims, 13 Drawing Sheets

(56) References Cited

U.S. PATENT DOCUMENTS

| | | |
|---|---|---|
| 2014/0319648 A1* | 10/2014 | Fenouillet-Beranger ............... H01L 27/1207 257/526 |
| 2016/0013206 A1 | 1/2016 | Vinet et al. |
| 2016/0358918 A1 | 12/2016 | Thompson et al. |
| 2017/0018622 A1 | 1/2017 | Ito |
| 2017/0040450 A1* | 2/2017 | Smith .................... H01L 21/84 |

* cited by examiner

SEMICONDUCTOR DEVICE AND FABRICATING METHOD OF THE SAME

This application claims priority from Korean Patent Application No. 10-2017-0078576 filed on Jun. 21, 2017 in the Korean Intellectual Property Office, the disclosure of which is incorporated herein by reference in its entirety.

BACKGROUND

Inventive concepts relates to a device and a method for fabricating the same.

Recent semiconductor elements have developed in a direction in which the elements can operate at higher speed with lower voltage, and the fabricating process of the semiconductor elements has developed in a direction in which the degree of integration is improved. Therefore, the highly-scaled highly-integrated semiconductor device patterns may be spaced apart from each other at fine pitches with a fine width.

A Fully Depleted Silicon On Insulator (FD-SOI) process has been developed to form a buried insulation layer on a substrate and form a channel and a transistor on the buried insulation layer during the process of reducing or miniaturizing the semiconductor element. The FD-SOI process may reduce parasitic capacitance and leakage currents by fully depleting the channel in the lower part of the transistor.

SUMMARY

Inventive concepts provide a semiconductor device having an FD-SOI structure.

Inventive concepts provide a method for fabricating the semiconductor device having the FD-SOI structure.

Inventive concepts are not limited to those mentioned above and another technical problem which has not been mentioned can be clearly understood by those skilled in the art from the description below.

In accordance with an example embodiment of inventive concepts, a semiconductor device a substrate including an active region defined by an element isolation film, an impurity region having a first conductivity type in the active region, a first semiconductor film of a second conductivity type on the impurity region, a buried insulating film on the first semiconductor film, a second semiconductor film on the buried insulating film, and a well contact connected to the first semiconductor film. The level of a lowermost surface of the first semiconductor film is higher than a level of a lowermost surface of the element isolation film.

In accordance with an example embodiment of inventive concepts, a semiconductor device includes a substrate including an active region defined by an element isolation film, a first impurity region of a first conductivity type and a second impurity region of a second conductivity type in the active region the first impurity region and the second impurity region adjacent to each other, a first semiconductor film of the second conductivity type on the first impurity region, a second semiconductor film of the first conductivity type on the second impurity region, a first buried insulating film on the first semiconductor film, a second buried insulating film on the second semiconductor film, a third semiconductor film on the first buried insulating film, a fourth semiconductor film on the fourth semiconductor film, a first well contact connected to the first semiconductor film, and a second well contact connected to the second semiconductor film. The first semiconductor film and the second semiconductor film are completely separated from each other by the element isolation film.

In accordance with an example embodiment of inventive concepts, a method for fabricating a semiconductor device includes providing a substrate having an active region defined by an element isolation film, a impurity region of a first conductivity type, a first semiconductor film of a second conductivity type, a buried insulating film, and a second semiconductor film stacked on the substrate, forming a gate structure on the second semiconductor film, forming a source region and a drain region in the second semiconductor film on both sides of the gate structure, partially etching the second semiconductor film and the buried insulating film to expose the first semiconductor film, and forming a well contact connected to the first semiconductor film. A level of a lowermost surface of the first semiconductor film is higher than a level of a lowermost surface of the element isolation film.

BRIEF DESCRIPTION OF THE DRAWINGS

The above and other aspects and features of inventive concepts will become more apparent by describing in detail exemplary embodiments thereof with reference to the attached drawings, in which.

DETAILED DESCRIPTION

Hereinafter, with reference to FIGS. 1 to 13, a description will be given in connection with a semiconductor device and a method for fabricating the same according to an embodiment of inventive concepts.

Figure 1:
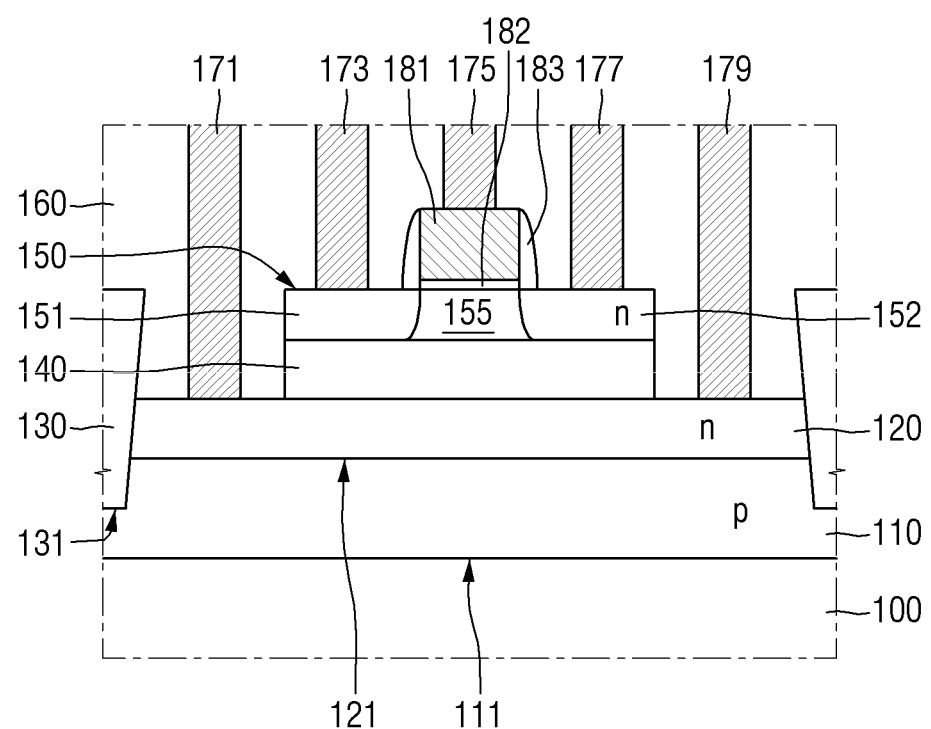
FIG. 1 is a cross-sectional view illustrating a semiconductor device according to some embodiments of inventive concepts.

FIG. 1 is a cross-sectional view illustrating a semiconductor device according to some embodiments of inventive concepts.

Referring to FIG. 1, a semiconductor device according to some embodiments of inventive concepts includes a substrate 100, a first impurity region 110, a first semiconductor film 120, a buried insulating film 140, a second semiconductor film 150, a gate structure 180, and contacts 171, 173, 175, 177, and 179.

The substrate 100 may be or include a Silicon-On-Insulator (SOI) substrate having an insulating film formed on a silicon substrate. For example, the first semiconductor film 120 and the second semiconductor film 150 inside the substrate 100 may be divided by the buried insulating film 140. In some embodiments of inventive concepts, the substrate 100 may be formed by bonding a wafer including the second semiconductor film 150 onto the buried insulating film 140 formed on the first semiconductor film 120; however, inventive concepts are not limited thereto, and other methods of forming the substrate 100 including Separation by Implantation of Oxygen (SIMOX) may be used.

An element isolation film 130 may be formed in the substrate 100. The element isolation film 130 may define an active region in the substrate 100. The element isolation film 130 may be formed of, for example, Shallow Trench Isolation (STI) or Local Oxidation of Silicon (LOCOS), but inventive concepts are not limited thereto.

An impurity region 110 may be formed in the substrate 100. The impurity region 110 may have a first conductivity type, and may be, for example, a P-type as illustrated in FIG. 1. The impurity region 110 may include boron; however, inventive concepts are not limited thereto.

The first semiconductor film 120 may be formed on the impurity region 110. The first semiconductor film 120 may have a second conductivity type, and may be, for example, an N-type, as illustrated in FIG. 1. The first semiconductor film 120 may include phosphorus and/or arsenic; however, inventive concepts are not limited thereto. Since the first impurity region 110 has the first conductivity type in the semiconductor device according to some embodiments of inventive concepts, the first impurity region 110 and the first semiconductor film 120 may have conductivity types opposite to each other.

The first semiconductor film 120 may be divided by the element isolation film 130. For example, a lowermost surface 121 of the first semiconductor film 120 may be located above a lowermost surface 131 of the element isolation film 130. Therefore, the distance from the top surface of the substrate 100 to the lowermost surface 121 of the first semiconductor film may be less than the distance from the top surface of the substrate 100 to the lowermost surface 131 of the element isolation film 130.

On the other hand, the lowermost surface 111 of the impurity region 110 may be located below the lowermost surface 131 of the element isolation film 130. Therefore, the distance from the top surface of the substrate 100 to the lowermost surface 111 of the impurity region 110 may be greater than the distance from the top surface of the substrate 100 to the lowermost surface 131 of the element isolation film 130.

As illustrated in FIG. 1, the impurity region 110 may not be in contact with the contacts 171, 173, 175, 177, and 179. A separate voltage may not be applied to the impurity region 110 by the contacts 171, 173, 177, and 179, and the impurity region 110 may be maintained in a floating state.

The first semiconductor film 120 may function as a body region in the semiconductor device according to some embodiments of inventive concepts. In addition, the first semiconductor film 120 may be completely separated from the second semiconductor film 150 by the buried insulating film 140. Therefore, the first semiconductor film 120 and the second semiconductor film 150 may not be in direct contact with each other.

The well contacts 171 and 179 may be electrically connected to the first semiconductor film 120. The bottom surfaces of the well contacts 171 and 179 may be in contact with the top surface of the first semiconductor film 120. The well contacts 171 and 179 may include a conductive material. For example, conductive materials may include at least one of polycrystalline silicon, a metal silicide compound, a conductive metal nitride, and/or a metal, but inventive concepts are not limited thereto.

Since a body bias voltage may be applied to the first semiconductor film 120 through the well contacts 171 and 179, a threshold voltage, a saturation voltage and a leakage current of the semiconductor device according to the embodiment of inventive concepts may be controlled.

Specifically, when a forward body bias (FBB) voltage is applied to the first semiconductor film 120 through the well contacts 171 and 179, speeding up the flow of the saturation current of the semiconductor device according to the embodiment of inventive concepts and reducing the power consumption when the gate voltage decreases accordingly may be possible. In contrast, when a reverse body bias (RBB) voltage is applied through the well contacts 171 and 179, the leakage current of the semiconductor device according to the embodiment of inventive concepts may decreases.

In some embodiments of inventive concepts, only one of the well contacts 171 and 179 may be formed on the first semiconductor film 120, unlike the configuration illustrated in FIG. 1.

The well contact 171 may be formed between the element isolation film 130 and the buried insulating film 140. In other words, another isolation film may not be interposed between the well contact 171 and the buried insulating film 140.

The buried insulating film 140 may be formed on the first semiconductor film 120. The buried insulating film 140 may include, for example, at least one of silicon oxide ($SiO_2$), silicon nitride (SiN), silicon oxynitride (SiON), and combinations thereof, but the invention is not limited thereto.

The second semiconductor film 150 may be formed on the impurity region 110. The second semiconductor film 150 may have a second conductivity type, and may be, for example, an N-type as illustrated in FIG. 1. Since the impurity region 110 has the first conductivity type in the semiconductor device according to some embodiments of inventive concepts, the impurity region 110 and the second semiconductor film 150 have conductivity types opposite to each other. Further, in the semiconductor device according to some embodiments of inventive concepts, since the first semiconductor film 120 has the second conductivity type, the second semiconductor film 150 has the same conductivity type as that of the impurity region 110.

The second semiconductor film 150 may include a source region 151, a drain region 152, and a channel region 155. The source region 151 and the drain region 152 may function as the source and drain of the gate structure 180, respectively.

The channel region 155 may include a movement route of electrons and/or holes from the source region 151 to the drain region 152 depending on whether or not a turn-on voltage of the gate structure 180 is applied. Since the semiconductor device according to some embodiments of inventive concepts has a structure of FD-SOI, a depth of a channel formed in the channel region 155 may be small, for example smaller than a depth of a channel in a bulk substrate. Therefore, the channel formed in the channel region 155 upon application of the turn-on voltage of the gate structure 180 may be fully depleted. Therefore, the semiconductor device according to some embodiments of inventive concepts may prevent or reduce occurrence of a short channel effect at the time of operation.

A source contact 173 may be formed on the source region 151. A source voltage may be applied to the source region 151 through the source contact 173. Although not illustrated in FIG. 1, in some embodiments of inventive concepts, a silicide film is formed on the top of the source region 151, and the resistance between the source region 151 and the source contact 173 may be reduced. The source contact 173 may include a conductive material. For example, these conductive materials may include at least one of polycrystalline silicon, a metal silicide compound, a conductive metal nitride, and a metal, but inventive concepts are not limited thereto.

A drain contact 177 may be formed on the drain region 152. A drain voltage may be applied to the drain region 152 via the drain contact 177. Likewise, in some embodiments of inventive concepts, a silicide film is formed on the top of the drain region 152, and the resistance between the drain region 152 and the drain contact 177 may be reduced. The drain contact 177 may include a conductive material. For example, these conductive materials may include at least one of polycrystalline silicon, a metal silicide compound, a conductive metal nitride, and a metal, but inventive concepts are not limited thereto.

Unlike FIG. 1, in some embodiments of inventive concepts, at least some of the source region 151 and the drain region 152 may also have a structure that protrudes beyond the top surface of the second semiconductor film 150.

In some embodiments of inventive concepts, the first semiconductor film 120, the buried insulating film 140 and the second semiconductor film 150 may comprise a capacitor. Specifically, when a first voltage is applied to the first semiconductor film 120 via the well contact 171 and a second voltage is applied to the second semiconductor film 150 via the source contact 173, the buried insulating film 140 may function as a dielectric and charges may be charged.

The gate structure 180 may be formed on the second semiconductor film 150. The gate structure 180 may include a gate electrode 181, a gate insulating film 182, and a gate spacer 183.

In some embodiments of inventive concepts, the gate structure 180 may be formed by a gate first process, as illustrated in FIG. 1, but is not limited thereto. The gate structure 180 may also be formed by a replacement process or a gate last process.

The gate electrode 181 may be formed to fill a trench defined by the gate spacer 183 and the gate insulating film 182. The gate electrode 181 may include, for example, a substance having high conductivity. In some embodiments of inventive concepts, the gate electrode 181 may be formed of, but is not limited to, polycrystalline silicon (poly Si), amorphous silicon (a-Si), titanium (Ti), titanium nitride (TiN), tungsten nitride (WN), titanium aluminium (TiAl), titanium aluminium nitride (TiAlN), tantalum nitride (TaSiN), titanium carbide (TiC), tantalum carbide (TaC), tantalum carbonitride (TaCN), tantalum silicon nitride (TaSiN), tantalum (Ta), cobalt (Co), rutetium (Ru), aluminum (Al) and/or tungsten (W).

The gate contact 175 may be formed on the gate electrode 181. A gate voltage may be applied to the gate electrode 181 through the gate contact 175. The gate contact 175 may include a conductive material. For example, these conductive materials may include at least one of polycrystalline silicon, a metal silicide compound, a conductive metal nitride, and a metal, but inventive concepts are not limited thereto.

The gate insulating film 182 may be formed between the gate electrode 181 and the second semiconductor film 150. Specifically, the gate insulating film 182 may be formed on the channel region 155 of the second semiconductor film 150.

The gate insulating film 182 may include silicon oxide, silicon oxynitride, silicon nitride, and a high dielectric material having a dielectric constant greater than silicon oxide. The high dielectric material may include, but is not limited to, for example, one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and/or lead zinc niobate.

The gate spacer 183 may be formed on the side walls of the gate electrode 181 and the gate insulating film 182. The gate spacer 183 may include, but is not limited to, at least one of, for example, silicon nitride, silicon oxynitride, silicon oxide, silicon oxycarbonitride (SiOCN), and combinations thereof. Although not illustrated, in some embodiments of inventive concepts, an interface film may be between, e.g. interposed between, the gate insulating film 182 and the channel region 155.

An interlayer insulating film 160 may be formed to cover the first semiconductor film 120, the element isolation film 130, the buried insulating film 140 and the second semiconductor film 150. The interlayer insulating film 160 may include, for example, an oxide film, but inventive concepts are not limited thereto.

As described above, the case where the impurity region 110 has a P-type, the first semiconductor film 120 has an N-type, and the second semiconductor film 150 has an N-type has been described referring to FIG. 1, but inventive concepts are not limited thereto. In some embodiments of inventive concepts, it also possible to configure a P-type semiconductor device such as a PMOS transistor in which the impurity region 110 has an N-type, the first semiconductor film 120 has a P-type, and the second semiconductor film 150 has a P-type.

Figure 2:
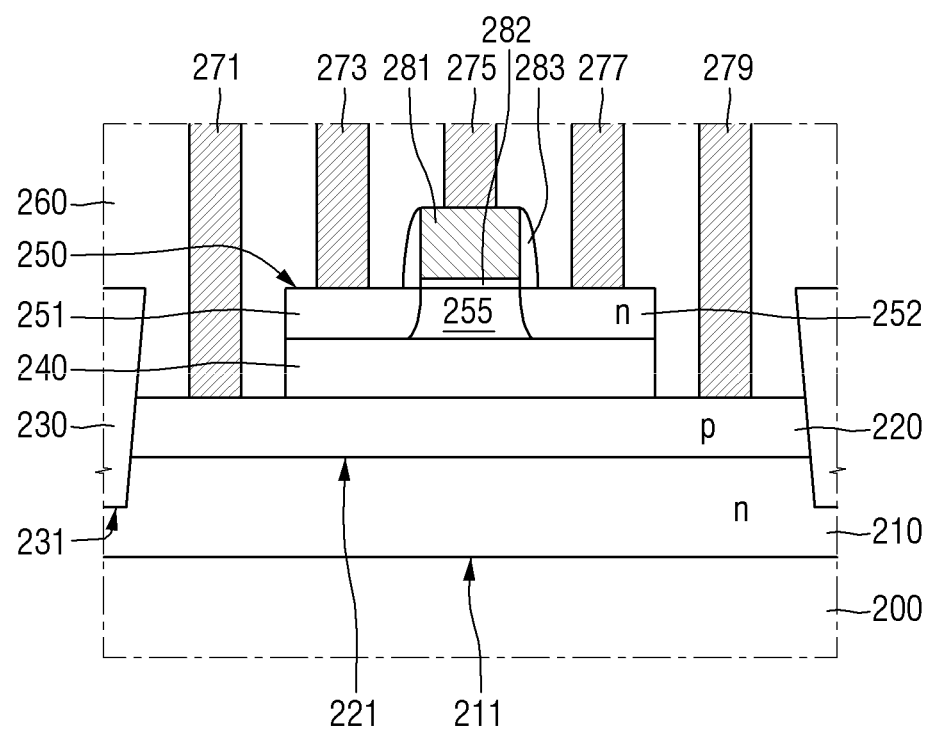
FIG. 2 is a cross-sectional view illustrating the semiconductor device according to some embodiments of inventive concepts.

FIG. 2 is a cross-sectional view illustrating a semiconductor device according to some embodiments of inventive concepts. Hereinafter, the contents overlapping the semiconductor device described with reference to FIG. 1 will be omitted and differences will be mainly described.

Referring to FIG. 2, in the semiconductor device according to some embodiments of inventive concepts, the conductivity type of the impurity region 210 may be the same as the conductivity type of the second semiconductor film 250. In addition, the conductivity type of the first semiconductor film 220 may be different from the conductivity type of the impurity region 210, and the conductivity type of the first semiconductor film 220 may be different from the conductivity type of the second semiconductor film 250.

Specifically, the first semiconductor film 220 may have a first conductivity type, and may be, for example, a P-type as illustrated in FIG. 2. The impurity region 210 and the second semiconductor film 250 may have the second conductivity type, and may be, for example, an N-type as illustrated in FIG. 2. The impurity region 210 may include, for example, phosphorus and/or arsenic.

However, inventive concepts are not limited thereto, and in some cases, the conductivity type of the first semiconductor film 220 may be an N-type, and the conductivity types of the impurity region 210 and the second semiconductor film 250 may be a P-type.

In the semiconductor device according to some embodiments of inventive concepts, except that the configurations of the conductivity types of the impurity region 210, the first semiconductor film 220, and the second semiconductor film 250 are different from each other, the configurations are the same as the configurations of the impurity region 110, the first semiconductor film 120 and the second semiconductor film 150 described referring to FIG. 1.

Further, the configurations of the substrate 200, the element isolation film 230, the buried insulating film 240, the contacts 271, 273, 275, 277 and 279, and the interlayer insulating film 260 are the same as those of the substrate 100, the element isolation film 130, the buried insulating film 240, and the contacts 171, 173, 175, 177, and 179 of FIG. 1.

The threshold voltage of the semiconductor device illustrated in FIG. 2 may be greater, e.g. greater in absolute value, than the threshold voltage of the semiconductor device illustrated in FIG. 1. For example, the semiconductor device illustrated in FIG. 2 may be a regular threshold voltage cell, and the semiconductor device illustrated in FIG. 1 may be a lower threshold voltage cell, but inventive concepts are not limited thereto.

Figure 3:
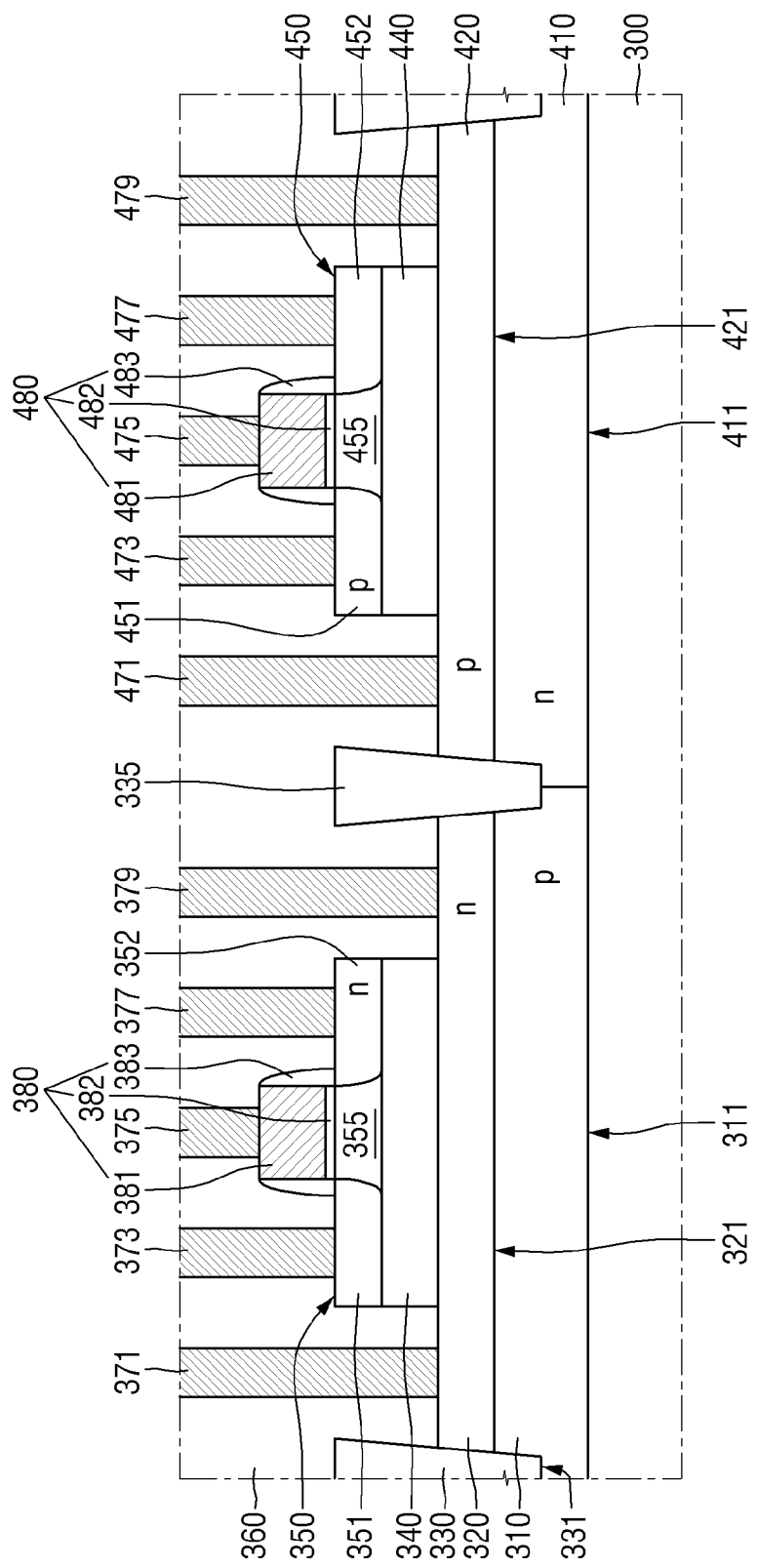
FIG. 3 is a cross-sectional view illustrating the semiconductor device according to some embodiments of inventive concepts.

FIG. 3 is a cross-sectional view illustrating a semiconductor device according to some embodiments of inventive concepts.

Referring to FIG. 3, a semiconductor device according to some embodiments of inventive concepts may include a CMOS (Complementary Metal Oxide Semiconductor) configuration in which an N-type transistor and a P-type transistor are connected to each other.

Specifically, a semiconductor device according to some embodiments of inventive concepts may include a first impurity region 310, a second impurity region 410, a first semiconductor film 320, a second semiconductor film 420, element isolation films 330 and 335, a first buried insulating film 340, a second buried insulating film 440, a third semiconductor film 350, a fourth semiconductor film 450, a first gate structure 380, a second gate structure 480, and contacts 371, 373, 375, 377, 379, 471, 473, 475, 477, and 479 formed on a substrate 300.

The substrate 300 may be substantially the same as the substrate 100 of FIG. 1 of the semiconductor device according to the above-described embodiment.

The first impurity region 310 and the second impurity region 410 may be formed on the substrate 300. The first impurity region 310 and the second impurity region 410 may be adjacent to each other, and at least a part of the first impurity region 310 and the second impurity region 410 may be in contact with each other. At least a part of the first impurity region 310 and the second impurity region 410 may be separated from each other by the element isolation film 335.

The lowermost part 311 of the first impurity region 310 and the lowermost part 411 of the second impurity region 410 may be located below the lowermost part 331 of the element isolation film 330.

The first impurity region 310 and the second impurity region 410 may have conductivity types opposite to each other. For example, the first impurity region 310 may have a first conductivity type, and the second impurity region 410 may have a second conductivity type. Specifically, as illustrated in FIG. 3, the first impurity region 310 may be a P-type and the second impurity region 410 may be an N-type.

The first semiconductor film 320 may be formed on the first impurity region 310, and the second semiconductor film 420 may be formed on the second impurity region 410. The first semiconductor film 320 and the second semiconductor film 420 may be completely separated from each other by the element isolation film 335. The first semiconductor film 320 and the second semiconductor film 420 may not be in contact with each other.

The lowermost part 321 of the first semiconductor film 320 may be located above the lowermost part 331 of the element isolation film 330. The lowermost part 421 of the second semiconductor film 420 may be located above the lowermost part 331 of the element isolation film 330. The first semiconductor film 320 and the second semiconductor film 420 may be electrically insulated from each other.

The first semiconductor film 320 and the second semiconductor film 420 may have conductivity types different from each other. The first semiconductor film 320 may have a second conductivity type, and the second semiconductor film 420 may have a first conductivity type. Specifically, as illustrated in FIG. 3, the first semiconductor film 320 may be a P-type and the second impurity region 410 may be an N-type.

The first impurity region 310 and the first semiconductor film 320 may have conductivity types different from each other. Specifically, as described above, the first impurity region 310 may have a first conductivity type, and the first semiconductor film 320 may have a second conductivity type.

The second impurity region 410 and the second semiconductor film 420 may have conductivity types opposite to each other. Specifically, as described above, the second impurity region 410 may have a second conductivity type, and the second semiconductor film 420 may have a first conductivity type.

The first buried insulating film 340 and the second semiconductor film 350 may be formed on the first semiconductor film 320. The first buried insulating film 340 and the third semiconductor film 350 may be the same, or substantially the same as the buried insulating film 140 and the second semiconductor film 150 of the semiconductor device described with reference to FIG. 1. Therefore, the first semiconductor film 320 and the third semiconductor film 350 may have the same conductivity type, and specifically, the first semiconductor film 320 and the third semiconductor film 350 may be an N-type.

The second buried insulating film 440 and the fourth semiconductor film 450 may be formed on the second semiconductor film 420. The second buried insulating film 440 may be the same, or substantially the same as the buried insulating film 140 of the semiconductor device described with reference to FIG. 1. On the other hand, the second semiconductor film 420 and the fourth semiconductor film 450 may have the same first conductivity type.

Figure 4:
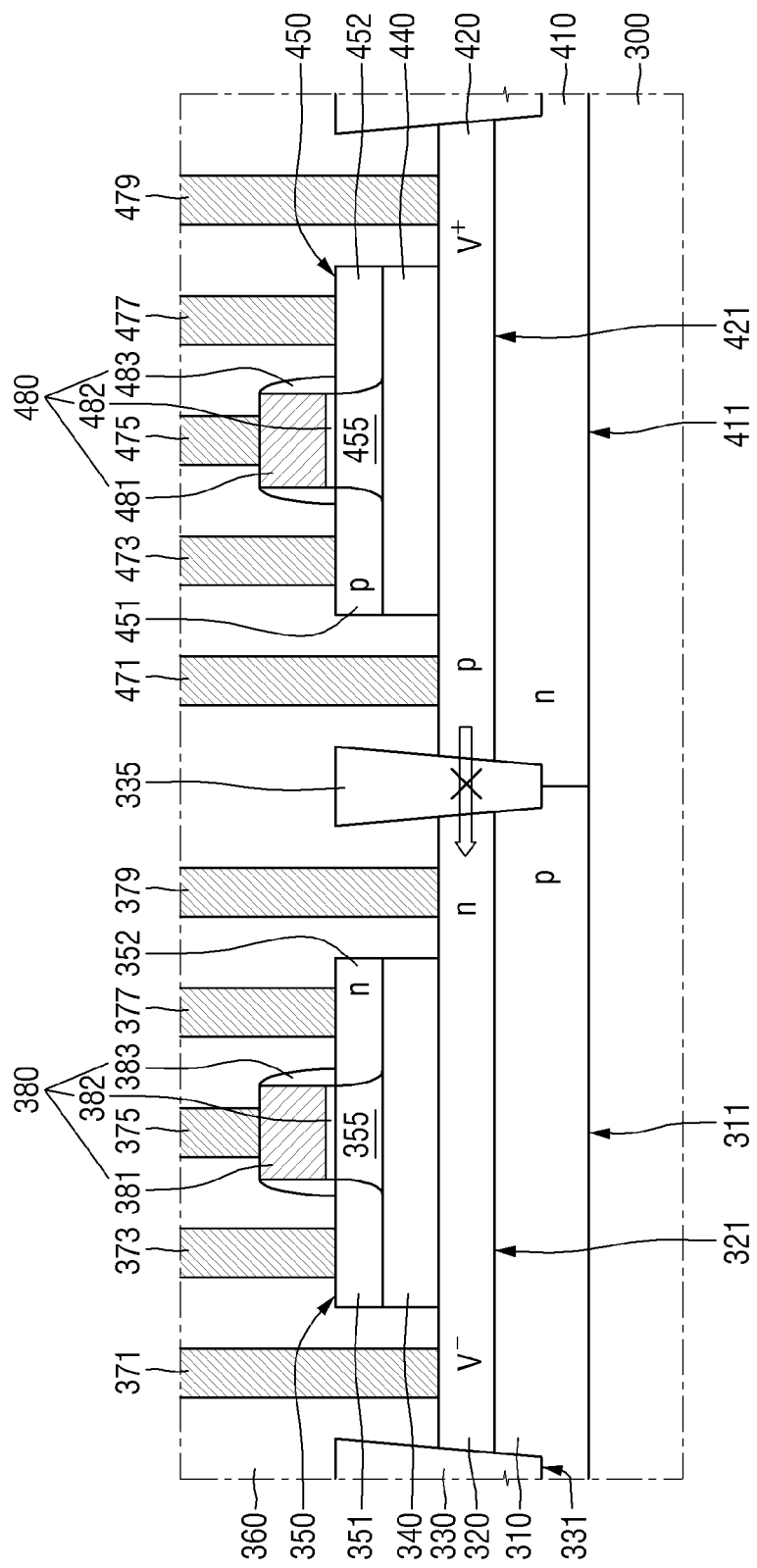
FIG. 4 is a cross-sectional view for explaining the operation of the semiconductor device of FIG. 3.

FIG. 4 is a cross-sectional view for explaining the operation of the semiconductor device of FIG. 3.

Referring to FIG. 4, the first body bias voltage V− may be applied by the well contacts 371, 379 formed on the first semiconductor film 320. Further, a second body bias voltage V+ larger than the first body bias voltage V− may be applied by the well contacts 471, 479 formed on the second semiconductor film 420. In the semiconductor device according to some embodiments of inventive concepts, even when the second body bias voltage V+ applied to the second semiconductor film 420 is larger than the first body bias voltage V-applied to the first semiconductor film 320, a forward bias is not formed between the second semiconductor film 420 and the first semiconductor film 320.

This is because, as described above, the first semiconductor film 320 and the second semiconductor film 420 are completely separated from each other by the element isolation film 335. Therefore, a forward bias is not formed between the first semiconductor film 320 and the second semiconductor film 420 electrically separated from each other.

As a result, the body bias voltage applied to the first semiconductor film 320 may not be limited by the body bias voltage applied to the second semiconductor film 420. The body bias voltages applied to the first semiconductor film 320 and the second semiconductor film 420 in the semiconductor device according to some embodiments of inventive concepts may be freely applied within a range that does not cause an hot carrier injection (HCl) phenomenon on the first buried insulating film 340 and the second buried insulating film 440 or does not exceed the breakdown voltage.

Referring to FIG. 3 again, the first gate structure 380 and the second gate structure 480 may be the same or substantially the same as the gate structure 180 described using FIG. 1 above. Further, the contacts 371, 373, 375, 377, 379, 471, 473, 475, 477, and 479 may be substantially the same as the contacts 171, 173, 175, 177, and 179 described with reference to FIG. 1.

Figure 5:
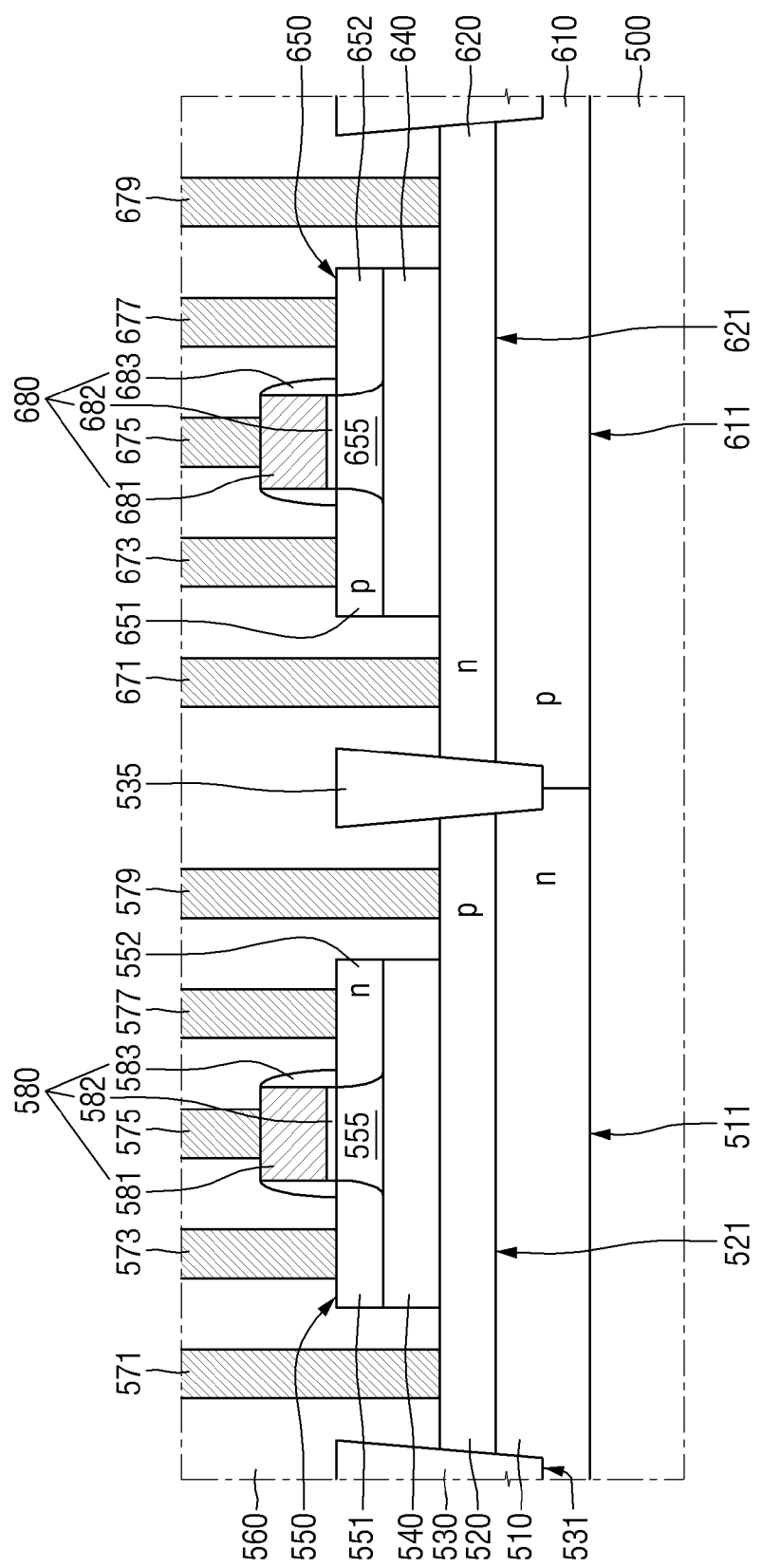
FIG. 5 is a cross-sectional view illustrating the semiconductor device according to some embodiments of inventive concepts.

FIG. 5 is a cross-sectional view illustrating the semiconductor device according to some embodiments of inventive concepts.

Referring to FIG. 5, the semiconductor device according to some embodiments of inventive concepts may include a first impurity region 510, a second impurity region 610, a first semiconductor film 520, a second semiconductor film 620, element isolation films 530, 535, a first buried insulating film 540, a second buried insulating film 640, a third semiconductor film 550, a fourth semiconductor film 650, a first gate structure 580, a second gate structure 680, and contacts 571, 573, 575, 577, 579, 671, 673, 675, 677, and 679 which are formed on the substrate 500.

The substrate 500 may be the same or substantially the same as the substrate (300 of FIG. 3) of the semiconductor device according to the above-described embodiment.

The first impurity region 510, the first semiconductor film 520, the first buried insulating film 540, and the third semiconductor film 550 may be the same or substantially the same as the impurity region 210, the first semiconductor film 220, the buried insulating film 240, and the second semiconductor film 250 of the semiconductor device described referring to FIG. 2, respectively.

The first impurity region 510 and the third semiconductor film 550 have the same second conductivity type, and the first semiconductor film 520 may have a first conductivity type. Specifically, as illustrated in FIG. 5, the first impurity region 510 and the third semiconductor film 550 may be an N-type, and the first semiconductor film 520 may be a P-type.

The second impurity region 610 and the fourth semiconductor film 650 may have the same first conductivity type, and the second semiconductor film 620 may have the second conductivity type. Specifically, as illustrated in FIG. 5, the second impurity region 610 and the fourth semiconductor film 650 may be a P-type, and the second semiconductor film 620 may be an N-type.

The lowermost part 511 of the first impurity region 510 and the lowermost part 611 of the second impurity region 610 may be located below the lowermost part 531 of the element isolation film 530.

The first semiconductor film 520 and the second semiconductor film 620 may be completely separated from each other by the element isolation film 535. The first semiconductor film 520 and the second semiconductor film 620 may not be in contact with each other. Therefore, the first semiconductor film 520 and the second semiconductor film 620 may be electrically insulated from each other.

The lowermost part 521 of the first semiconductor film 520 and the lowermost part 621 of the second semiconductor film 620 may be located above the lowermost part 531 of the element isolation film 530.

As described above, the first semiconductor film 520 may have a first conductivity type, and the second semiconductor film 620 may have a second conductivity type. Specifically, as illustrated in FIG. 5, the first semiconductor film 520 may be an N-type, and the second semiconductor film 620 may be an N-type.

Figure 6:
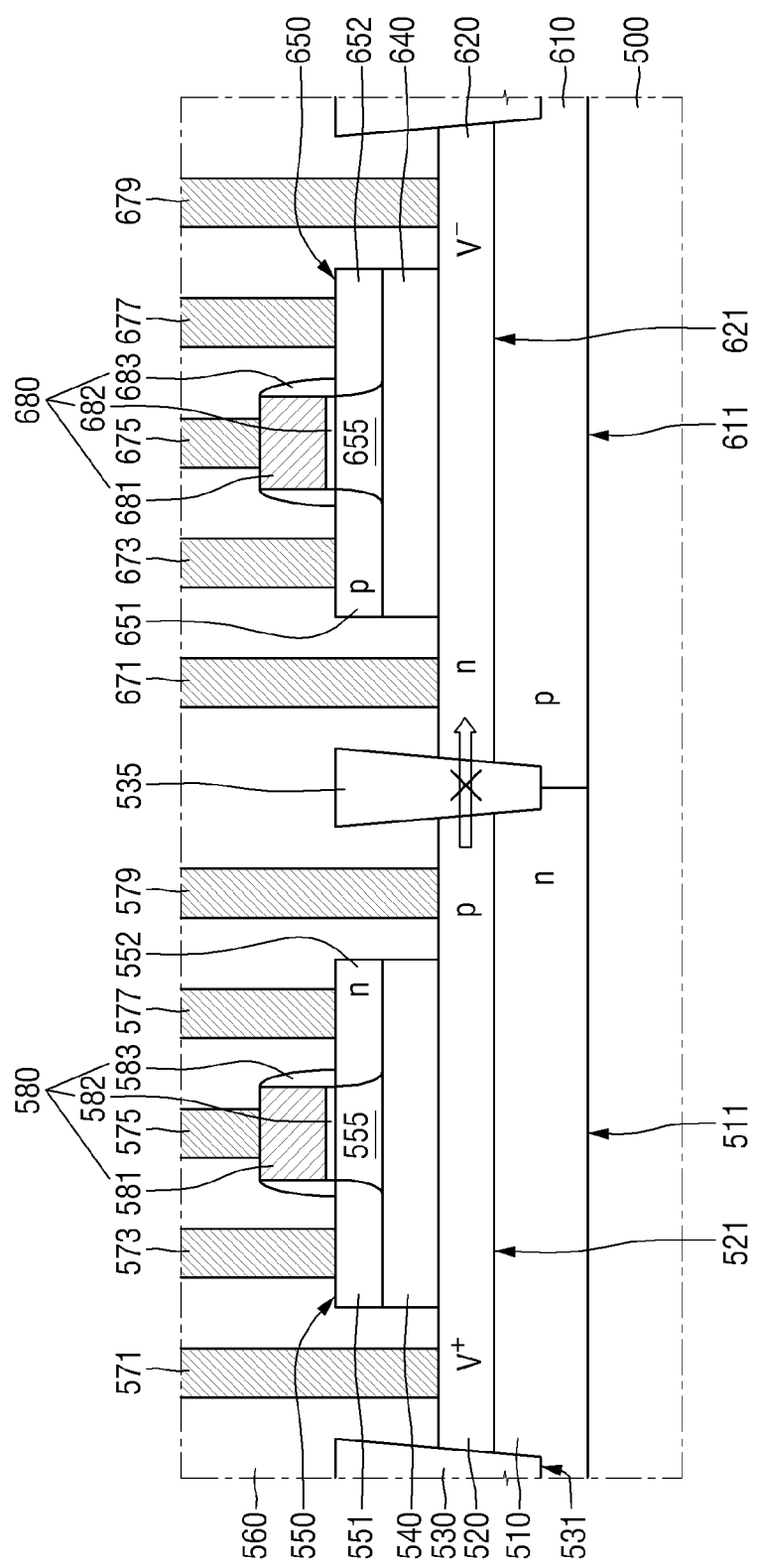
FIG. 6 is a cross-sectional view for explaining the operation of the semiconductor device of FIG. 5.

FIG. 6 is a cross-sectional view for explaining the operation of the semiconductor device of FIG. 5.

Referring to FIG. 6, the first body bias voltage V+ may be applied by the well contacts 571, 579 formed on the first semiconductor film 520. In addition, a second body bias voltage V− smaller than the first body bias voltage V+ may be applied by the well contacts 671, 679 formed on the second semiconductor film 620. In the semiconductor device according to some embodiments of inventive concepts, even when the first body bias voltage V+ applied to the first semiconductor film 520 is higher than the second body bias voltage V− applied to the second semiconductor film 620, a forward bias is not formed between the first semiconductor film 520 and the second semiconductor film 620, similar to the case of the semiconductor device described above using FIG. 4.

Consequentially, the body bias voltage applied to the first semiconductor film 520 may not be limited by the body bias voltage applied to the second semiconductor film 620.

Referring to FIG. 5 again, the first gate structure 580 and the second gate structure 680 may be the same or substantially the same as the first gate structure 380 and the second gate structure 480 described above referring to FIG. 5, respectively. Also, the contacts 571, 573, 575, 577, 579, 671, 673, 675, 677, and 679 may be substantially the same as the contacts 371, 373, 375, 377, 379, 471, 473, 475, 477, and 479 of FIG. 5.

FIGS. 7 to 10 are intermediate step diagrams for explaining a method for fabricating a semiconductor device according to some embodiments of inventive concepts.

Figure 7:
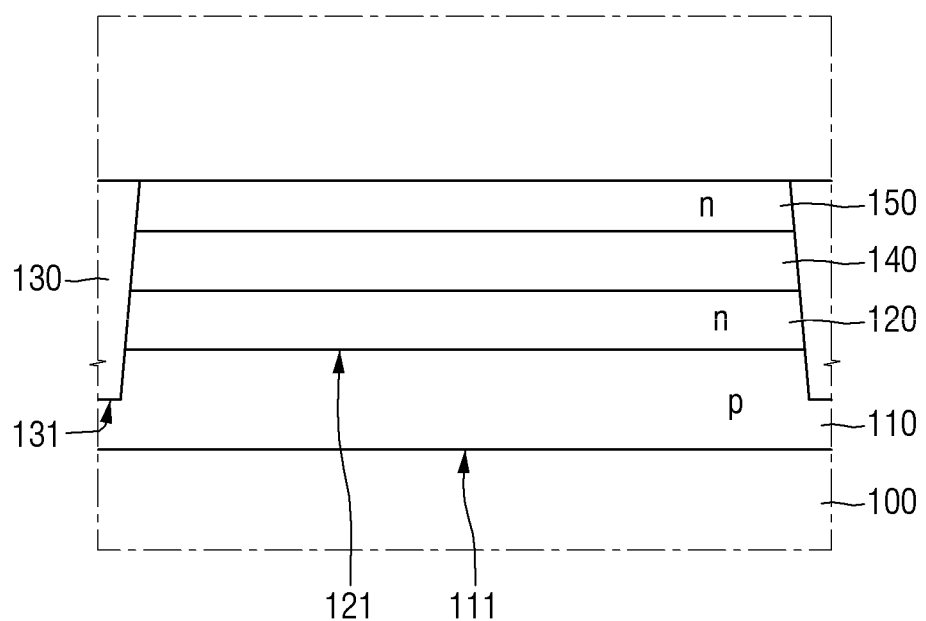
FIGS. 7 to 10 are intermediate step diagrams for explaining a method for fabricating the semiconductor device according to some embodiments of inventive concepts.

First, referring to FIG. 7, a substrate 100 is provided in which an active region is defined by the element isolation film 130, and the impurity region 110, the first semiconductor film 120, the buried insulating film 140, and the second semiconductor film 150 are sequentially stacked.

In some embodiments of inventive concepts, the substrate 100 may be formed by bonding a second semiconductor film 150 onto the semiconductor substrate in which the impurity region 110, the first semiconductor film 120, and the second semiconductor film 150 are formed, but inventive concepts are not limited thereto.

As in the semiconductor device described above with reference to FIG. 1, the impurity region 110 may have a first conductivity type (e.g., a P-type), and the first semiconductor film 120 and the second semiconductor film 150 may have a second conductivity type (e.g., an N-type).

Figure 8:
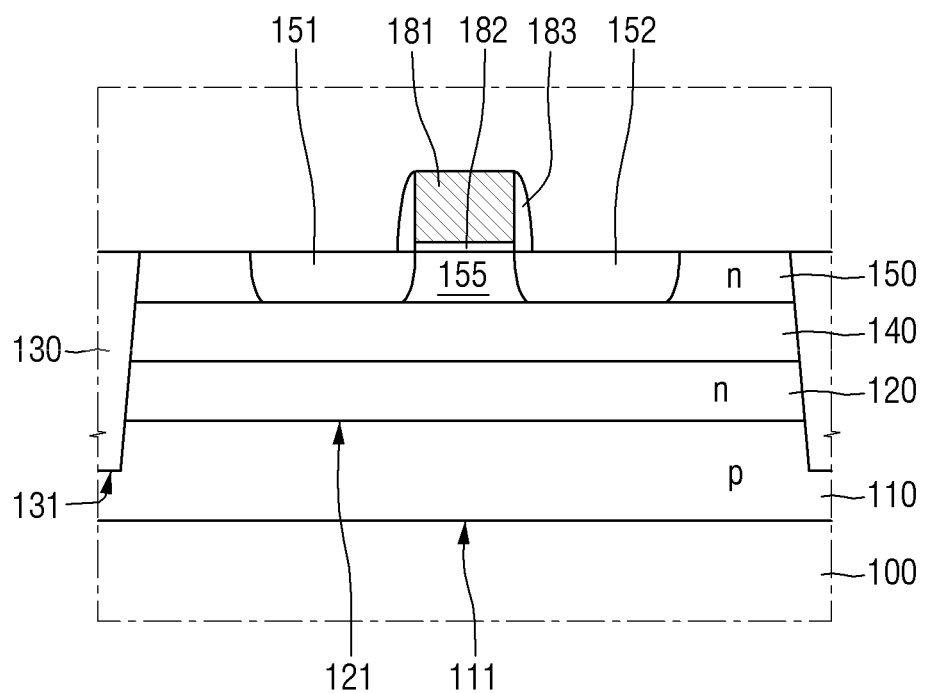

Subsequently, referring to FIG. 8, the source region 151 and the drain region 152 are formed inside the second semiconductor film 150.

The source region 151 and the drain region 152 may be formed, for example, by epitaxial growth from the second semiconductor film 150, but inventive concepts are not limited thereto. Alternatively, by doping the second semiconductor film 150 with impurities, using the gate insulating film 182 and the gate electrode 181 as a mask after forming the gate insulating film 182 and the gate electrode 181, the source region 151 and the drain region 152 may also be formed.

The gate structure 180 is formed on the second semiconductor film 150 on which the source region 151 and the drain region 152 are formed. Formation of the gate structure 180 may include formation of an insulating film and a conductive film of the second semiconductor film 150, patterning of the insulating film and the conductive film to form a gate insulating film 182 and a gate electrode 181 on the channel region 155, formation of a spacer film for covering the gate electrode 181, and etching of the space film to form a gate spacer 183. The technique of forming the gate structure 180 by the gate first method was described, but inventive concepts are not limited thereto, and the gate structure 180 may be formed by the gate last method.

Figure 9:
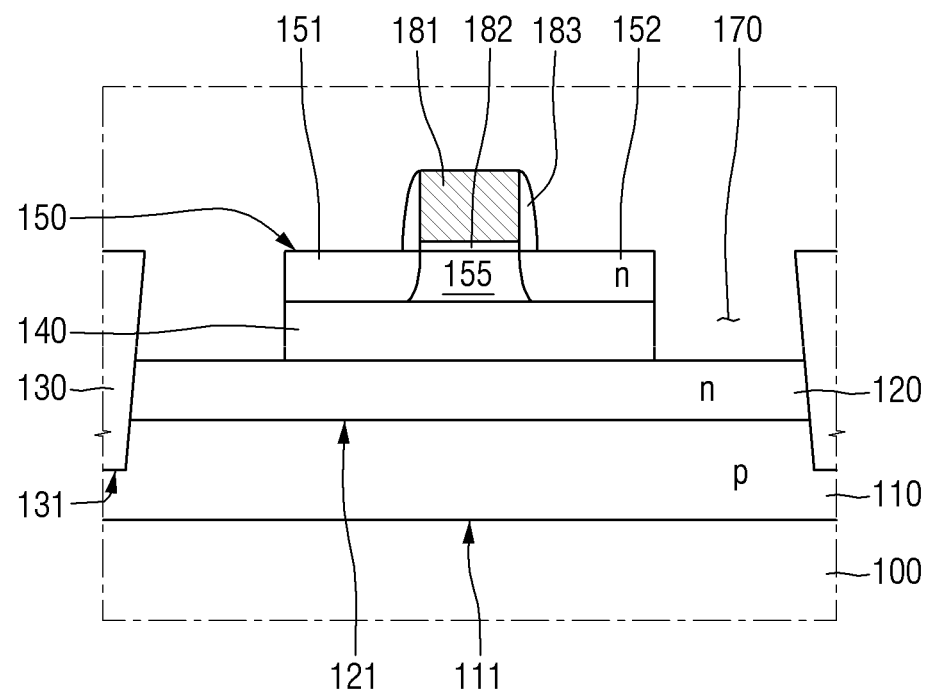

Next, referring to FIG. 9, the second semiconductor film 150 and the buried insulating film 140 are partially etched to form a trench 170, and the top surface of the first semiconductor film 120 is exposed. The formation of the trench 170 may include formation of a mask pattern on the second semiconductor film 150, and etching of the second semiconductor film 150 and the buried insulating film 140, using the mask pattern.

As will be described later, well contacts 171 and 179 may be formed on the trench 170. The trench 170 may be just adjacent to the second semiconductor film 150 and the buried insulating film 140. That is, no separate element isolation film is interposed between the trench 170 and the second semiconductor film 150, or between the trench 170 and the buried insulating film 140.

Figure 10:
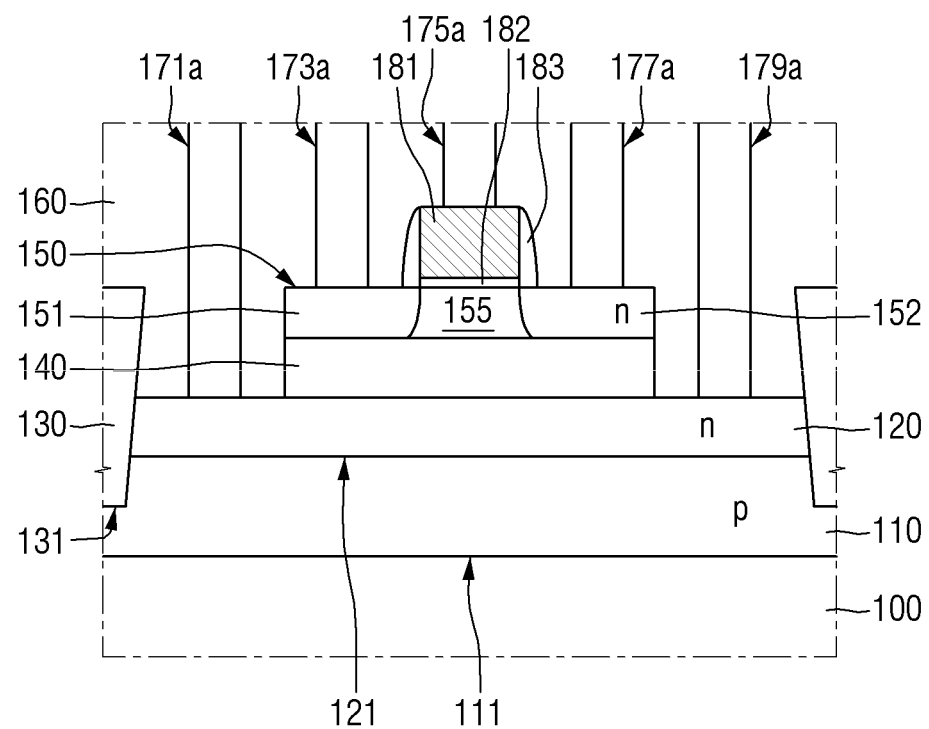

Referring to FIG. 10, an interlayer insulating film 160 is formed covering the element isolation film 130, the first semiconductor film 120, the second semiconductor film 150, and the gate structure 180. The interlayer insulating film 160 may be formed to completely fill the trench 170.

Subsequently, contact holes 171a, 173a, 175a, 177a, and 179a are formed in the interlayer insulating film 160. The well contact holes 171a and 179a are formed on the first semiconductor film 120, the source contact hole 173a and the drain contact hole 175a are formed on the second semiconductor film 150, and the gate contact hole 175a may be formed on the gate electrode 181. In some embodiments of inventive concepts, one contact hole of two contact holes 171a and 179a may not be formed.

Referring to FIG. 1, conductive substances are filled in the contact holes 171a, 173a, 175a, 177a, and 179a to form the contacts 171, 173, 175, 177, and 179.

Figure 11:
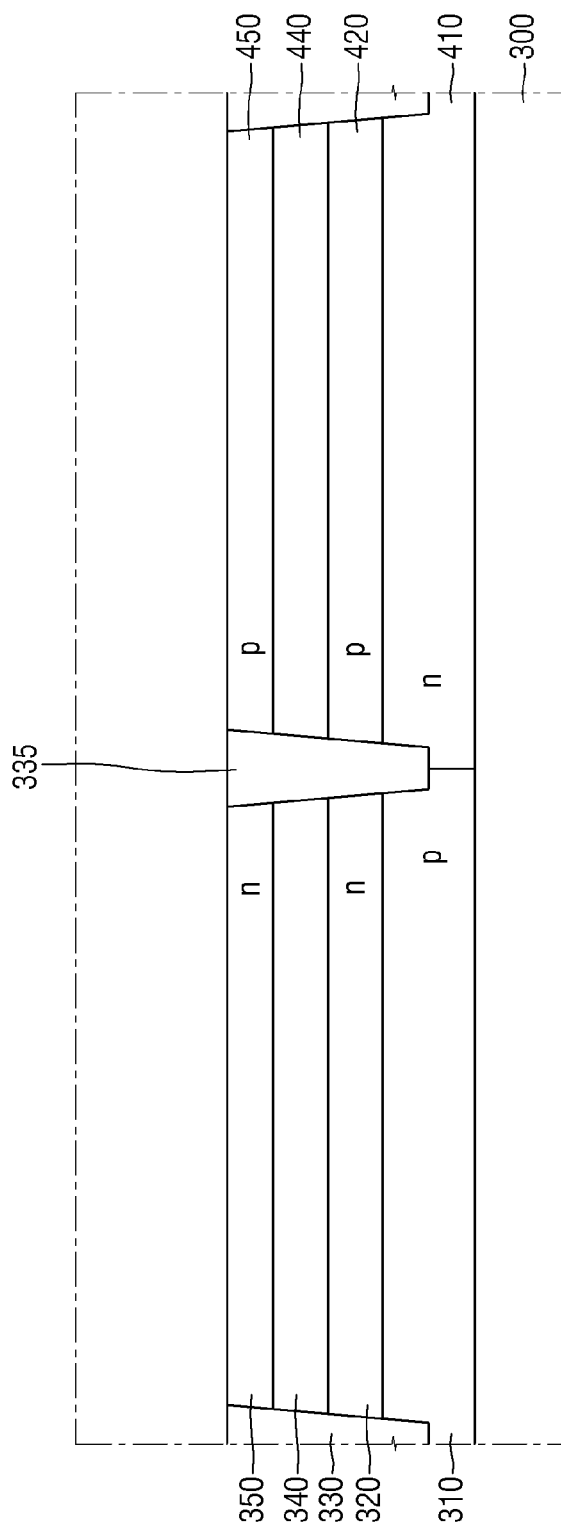
FIGS. 11 to 13 are intermediate step diagrams for explaining the method for fabricating the semiconductor device according to some embodiments of inventive concepts.
Figure 12:
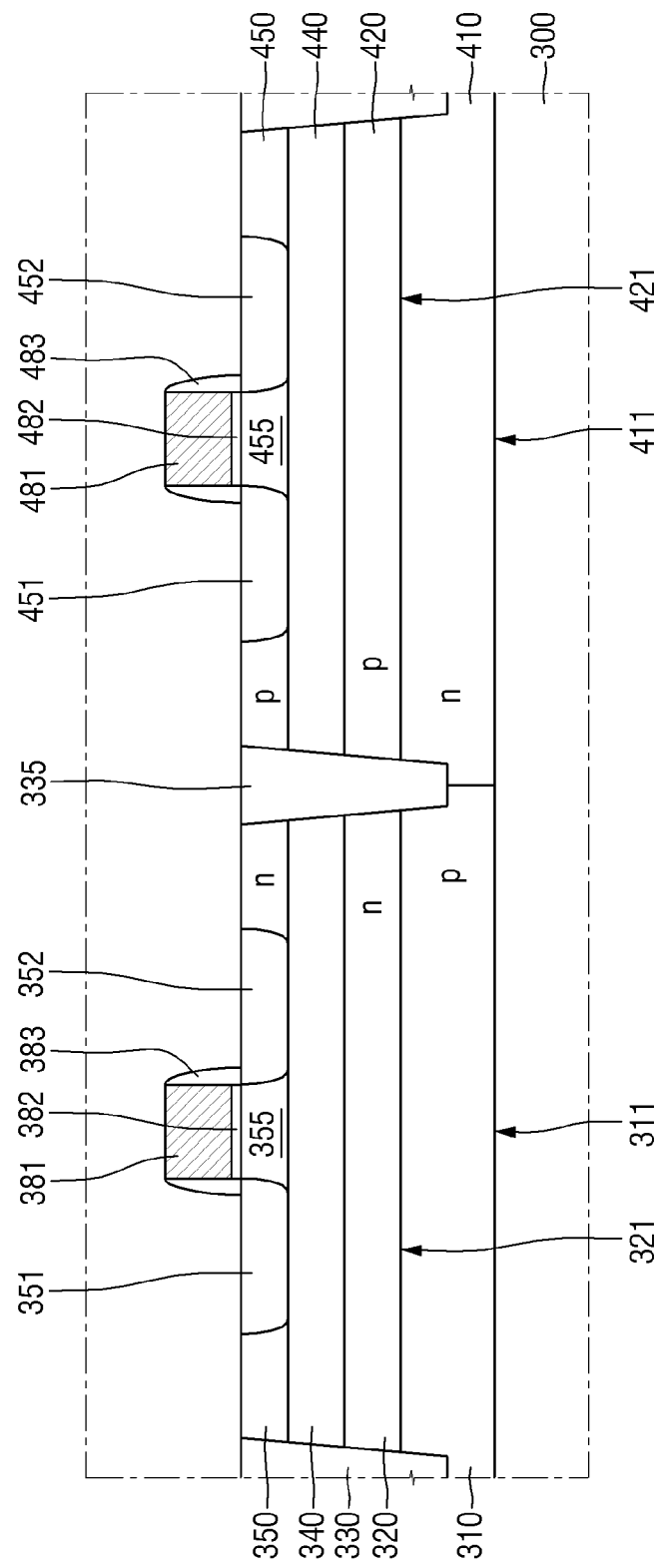
Figure 13:
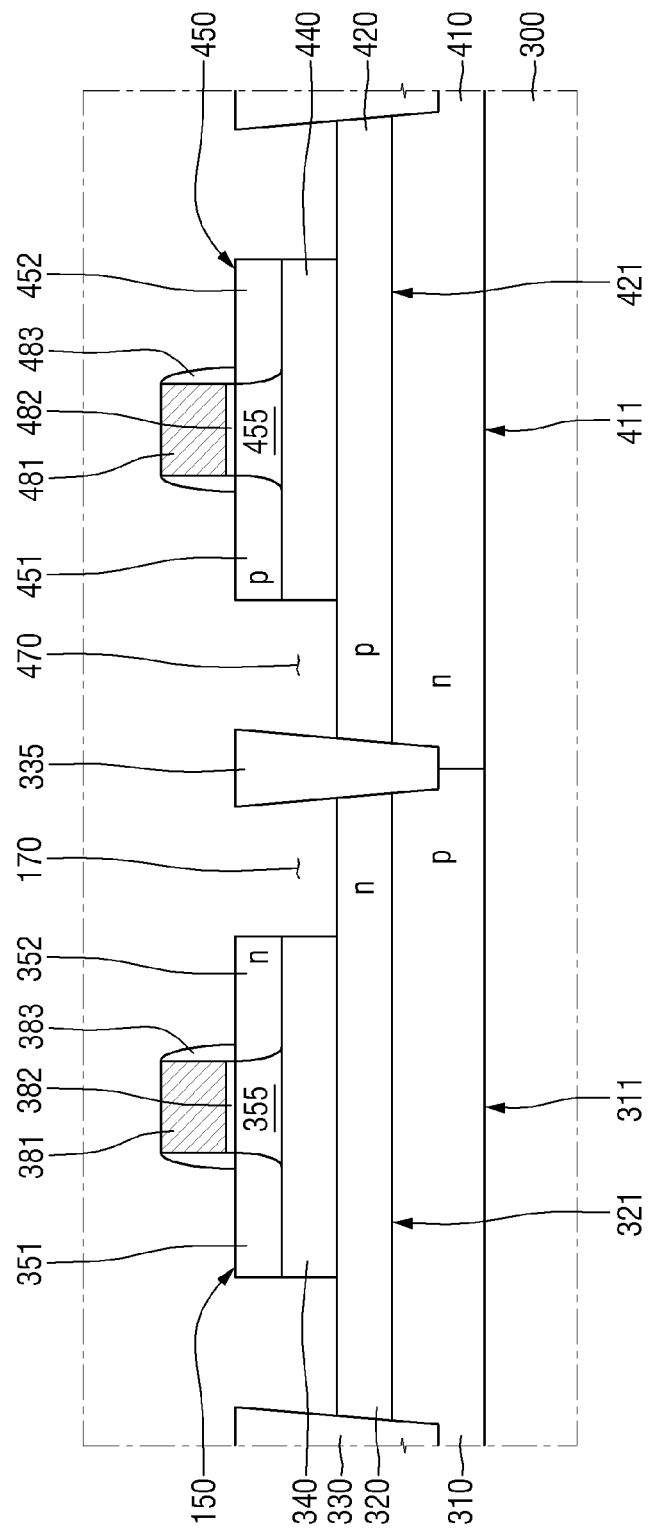

FIGS. 11 to 13 are intermediate step diagrams for explaining a method for fabricating a semiconductor device according to some embodiments of inventive concepts.

First, referring to FIG. 11, a substrate 300 is provided in which an active region is defined by the element isolation films 330 and 335, and the first impurity region 310 and the second impurity region 410, the first semiconductor film 320 and the second semiconductor film 420, the first buried insulating film 340 and the second buried insulating film 440, and the third semiconductor film 350 and the fourth semiconductor film 450 are sequentially stacked.

In some embodiments of inventive concepts, the substrate 100 may be formed by bonding the third semiconductor film 350 and the fourth semiconductor film 450 onto the semiconductor substrate on which the first impurity region 310 and the second impurity region 410, the first semiconductor film 320 and the second semiconductor film 420, and the first buried insulating film 340 and the second buried insulating film 440 are formed, but inventive concepts are not limited thereto.

The first semiconductor film 320 and the second semiconductor film 420 may be separated from each other by the element isolation film 335. The third semiconductor film 350 and the fourth semiconductor film 450 may be separated from each other by the element isolation film 335.

As in the semiconductor device described above with reference to FIG. 3, the first impurity region 310 and the second impurity region 410 may have a first conductivity type (e.g., a P-type) and a second conductivity type (e.g., an N-type), respectively. The first semiconductor film 320 and the second semiconductor film 420 may have a second conductivity type (e.g., an N-type) and a first conductivity type (e.g., a P-type), respectively. The third semiconductor film 350 may have the same conductivity type as that of the first semiconductor film 320, and the fourth semiconductor film 450 may have the same conductivity type as that of the second semiconductor film 350.

Next, referring to FIG. 12, a first source 351, a second source 451, a first drain 352 and a second drain 452 are formed in the third semiconductor film 350 and the fourth semiconductor film 450. The sources 351, 451 and the drains 352, 452 may be formed by doping the third semiconductor film 350 and the fourth semiconductor film 450 with impurities or by epitaxial growth.

A first gate structure 380 and a second gate structure 480 are formed on the third semiconductor film 350 and the fourth semiconductor film 450. For example, an insulating film and a conductive film are formed on the third semiconductor film 350 and the fourth semiconductor film 450 and are patterned to form the gate insulating films 381, 481 and the gate electrodes 382, 482, and gate spacers 385, 485 are formed on the side walls of the gate electrodes 382, 482. Techniques for forming the gate structures 380, 480 by the gate first method were described, but inventive concepts are not limited thereto, and the gate structures 380, 480 may formed by the gate last method.

Next, referring to FIG. 13, the third semiconductor film 350, the fourth semiconductor film 450, the first buried insulating film 340, and the second buried insulating film 440 are partially etched to form the trenches 370, 470, and the top surfaces of the first semiconductor film 320 and the second semiconductor film 420 are exposed. As described above, another element isolation film is not interposed between the first trench 370 and the third semiconductor film 350, and another element isolation film is not interposed between the second trench 470 and the fourth semiconductor film 450.

Referring to FIG. 3, the interlayer insulating film 360 is formed, a contact hole is formed by etching the interlayer insulating film 360, and the contact hole is filled with a conductive material to form the contacts 371, 373, 375, 377, 379, 471, 473, 475, 477, and 479.

While inventive concepts has been particularly illustrated and described with reference to exemplary embodiments thereof, it will be understood by those of ordinary skill in the art that various changes in form and detail may be made therein without departing from the spirit and scope of inventive concepts as defined by the following claims. The exemplary embodiments should be considered in a descriptive sense only and not for purposes of limitation.

What is claimed is:

1. A semiconductor device comprising:
 a substrate including an active region defined by an element isolation film;

an impurity region having a first conductivity type in the active region;
a first semiconductor film of a second conductivity type on the impurity region;
a buried insulating film on the first semiconductor film;
a second semiconductor film on the buried insulating film;
an interlayer insulating film covering an upper surface of the second semiconductor film, on the first semiconductor film; and
a well contact connected to the first semiconductor film in a trench, the trench between the element isolation film and the buried insulating film, wherein
the well contact is spaced apart from the element isolation film,
the trench includes a first portion and a second portion between the first portion and the buried insulating film,
the well contact fills the first portion of the trench, the interlayer insulating film fills the second portion of the trench, and
a level of a lowermost surface of the first semiconductor film is higher than a level of a lowermost surface of the element isolation film.

2. The semiconductor device of claim 1, wherein the second semiconductor film has the second conductivity type.

3. The semiconductor device of claim 1, wherein the first semiconductor film is configured to receive a body bias voltage through the well contact.

4. The semiconductor device of claim 1, wherein the element isolation film is not between the well contact and the second semiconductor film.

5. The semiconductor device of claim 1, wherein a bottom surface of the well contact is in direct contact with a top surface of the first semiconductor film.

6. The semiconductor device of claim 1, wherein the second semiconductor film has the first conductivity type.

7. The semiconductor device of claim 1, further comprising:
a gate structure formed on the second semiconductor film.

8. The semiconductor device of claim 1, wherein the first semiconductor film and the second semiconductor film are configured to be electrodes and the buried insulating film is configured to be a dielectric of a capacitor.

9. The semiconductor device of claim 1, wherein the impurity region is configured to be maintained in a floating state during operation of the semiconductor device.

10. The semiconductor device of claim 1, wherein a bottom surface of the well contact contacts a top surface of the first semiconductor film.

11. A semiconductor device comprising:
a substrate including an active region defined by an element isolation film;
a first impurity region of a first conductivity type and a second impurity region of a second conductivity type in the active region, the first impurity region and the second impurity region adjacent to each other;
a first semiconductor film of the second conductivity type on the first impurity region;
a second semiconductor film of the first conductivity type on the second impurity region;
a first buried insulating film on the first semiconductor film;
a second buried insulating film on the second semiconductor film;
a third semiconductor film on the first buried insulating film;
a fourth semiconductor film on the second buried insulating film;
an interlayer insulating film covering an upper surface of the third semiconductor film on the first semiconductor film;
a first well contact connected to the first semiconductor film in a trench; and
a second well contact connected to the second semiconductor film, wherein
the first well contact is spaced apart from the element isolation film,
the trench includes a first portion and a second portion between the first portion and the first buried insulating film,
the first well contact fills the first portion of the trench, the interlayer insulating film fills the second portion of the trench,
the first semiconductor film and the second semiconductor film are completely separated from each other by the element isolation film, and
an upper surface of the first impurity region and an upper surface of the second impurity region have substantially the same level.

12. The semiconductor device of claim 11, wherein levels of bottom surfaces of the first semiconductor film and the second semiconductor film are higher than a level of a bottom surface of the element isolation film.

13. The semiconductor device of claim 11, wherein the third semiconductor film has the second conductivity type, and the fourth semiconductor film has the first conductivity type.

14. The semiconductor device of claim 11, wherein the element isolation film is not between the first well contact and the third semiconductor film.

15. The semiconductor device of claim 14, wherein the element isolation film is not between the second well contact and the fourth semiconductor film.

16. The semiconductor device of claim 11, wherein the third semiconductor film has the first conductivity type, and the fourth semiconductor film has the second conductivity type.

17. The semiconductor device of claim 12, further comprising:
a first gate structure formed on the third semiconductor film, and a second gate structure formed on the fourth semiconductor film.

18. The semiconductor device of claim 17, wherein the first semiconductor film is configured to receive a first body bias voltage through the first well contact, and the second semiconductor film is configured to receive a second body bias voltage through the second well contact.

19. The semiconductor device of claim 18, wherein the first body bias voltage and the second body bias voltage are different from each other.

20. A semiconductor device comprising:
a substrate including an active region defined by an element isolation film;
a first impurity region of a first conductivity type and a second impurity region of a second conductivity type in the active region, the first impurity region and the second impurity region adjacent to each other;
a first semiconductor film of the second conductivity type on the first impurity region;
a second semiconductor film of the first conductivity type on the second impurity region;
a first buried insulating film on the first semiconductor film;
a second buried insulating film on the second semiconductor film;

a third semiconductor film on the first buried insulating film;
a fourth semiconductor film on the second buried insulating film;
an interlayer insulating film covering an upper surface of the third semiconductor film on the first semiconductor film;
a first well contact connected to the first semiconductor film in a trench; and
a second well contact connected to the second semiconductor film, wherein
the first well contact is spaced apart from the element isolation film,
the trench includes a first portion and a second portion between the first portion and the first buried insulating film,
the first well contact fills the first portion of the trench, the interlayer insulating film fills the second portion of the trench,
first semiconductor film and the second semiconductor film are completely separated from each other by the element isolation film, and
a bottom surface of the element isolation film is directly contacting with the first impurity region and the second impurity region.

* * * * *